(12) United States Patent
Zhou

(10) Patent No.: US 12,112,981 B2
(45) Date of Patent: Oct. 8, 2024

(54) SEMICONDUCTOR DEVICE AND METHOD FOR FABRICATING SEMICONDUCTOR DEVICE

(71) Applicant: United Microelectronics Corp., Hsinchu (TW)

(72) Inventor: Zhi-Biao Zhou, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 409 days.

(21) Appl. No.: 17/679,133

(22) Filed: Feb. 24, 2022

(65) Prior Publication Data

US 2022/0181199 A1    Jun. 9, 2022

Related U.S. Application Data

(63) Continuation-in-part of application No. 16/884,081, filed on May 27, 2020, now Pat. No. 11,289,368.

(30) Foreign Application Priority Data

Apr. 27, 2020   (CN) .......................... 202010344144.4

(51) Int. Cl.
*H01L 21/00* (2006.01)
*H01L 21/768* (2006.01)
(Continued)

(52) U.S. Cl.
CPC .... *H01L 21/7682* (2013.01); *H01L 21/76897* (2013.01); *H01L 23/5222* (2013.01); *H01L 27/1207* (2013.01)

(58) Field of Classification Search
CPC ........... H01L 21/7682; H01L 21/76897; H01L 23/5222; H01L 27/1207
See application file for complete search history.

(56) References Cited

U.S. PATENT DOCUMENTS

| 6,255,712 B1 * | 7/2001 | Clevenger ........... H01L 21/7682 257/E21.573 |
| 6,281,080 B1 * | 8/2001 | Tung ................... H01L 27/0266 438/281 |

(Continued)

FOREIGN PATENT DOCUMENTS

| CN | 102637628 | 8/2012 |
| CN | 102768985 | 11/2012 |

(Continued)

OTHER PUBLICATIONS

"Office Action of China Counterpart Application", issued on Jun. 24, 2023, p. 1-p. 7.

*Primary Examiner* — Laura M Menz
(74) *Attorney, Agent, or Firm* — JCIPRNET

(57) ABSTRACT

A semiconductor device is provided. The semiconductor device includes a device substrate, having a device structure layer and a buried dielectric layer, wherein the buried dielectric layer is disposed on a semiconductor layer of the device structure layer and the device substrate comprises a device structure. A metal layer is disposed on the buried dielectric layer and surrounded by a first inter-layer dielectric (ILD) layer. A region of the metal layer has a plurality of openings. The buried dielectric layer has an air gap under and exposing the region of the metal layer with the openings, wherein the air gap is located above the device structure in the device substrate. A second ILD layer is disposed on the metal layer and sealing the air gap at the openings of the metal layer.

20 Claims, 19 Drawing Sheets

(51) Int. Cl.
*H01L 23/522* (2006.01)
*H01L 27/12* (2006.01)

(56) References Cited

U.S. PATENT DOCUMENTS

| | | | | |
|---|---|---|---|---|
| 6,387,818 | B1 | 5/2002 | Lopatin | |
| 6,791,155 | B1* | 9/2004 | Lo | H01L 21/76224 |
| | | | | 438/335 |
| 7,038,289 | B2* | 5/2006 | Marty | H01L 21/76232 |
| | | | | 257/E21.549 |
| 7,534,696 | B2* | 5/2009 | Jahnes | H01L 21/76835 |
| | | | | 257/E21.573 |
| 8,110,879 | B2* | 2/2012 | Torres | H01L 21/7682 |
| | | | | 257/E21.267 |
| 8,575,680 | B2* | 11/2013 | Shin | H10B 41/30 |
| | | | | 257/315 |
| 9,653,347 | B1* | 5/2017 | Leobandung | H01L 23/53266 |
| 9,659,865 | B2* | 5/2017 | Saka | H01L 29/78 |
| 9,887,159 | B1* | 2/2018 | Zhu | H01L 21/76816 |
| 10,049,941 | B2* | 8/2018 | Shue | H01L 21/76289 |
| 10,134,836 | B2* | 11/2018 | Zhou | H01L 23/535 |
| 10,157,777 | B2* | 12/2018 | He | H01L 21/7682 |
| 10,211,146 | B2* | 2/2019 | He | H01L 23/5222 |
| 10,438,843 | B1* | 10/2019 | Fu | H01L 21/76832 |
| 10,504,873 | B1* | 12/2019 | Chen | H01L 23/5226 |
| 10,515,876 | B1* | 12/2019 | Zhou | H01L 21/76807 |
| 10,566,418 | B2* | 2/2020 | Zhou | H01L 21/31053 |
| 10,763,160 | B1* | 9/2020 | Penny | H01L 21/7682 |
| 11,127,678 | B2* | 9/2021 | McGahay | H01L 29/0649 |
| 11,289,368 | B2* | 3/2022 | Zhou | H01L 23/528 |
| 2003/0098491 | A1* | 5/2003 | Tsutsumi | H01L 21/76237 |
| | | | | 257/E21.573 |
| 2004/0026761 | A1* | 2/2004 | Leonardi | H01L 21/76264 |
| | | | | 257/E21.564 |
| 2005/0139952 | A1* | 6/2005 | Koh | H01L 21/76232 |
| | | | | 257/E21.549 |
| 2005/0245043 | A1* | 11/2005 | Martin | H01L 21/764 |
| | | | | 257/E21.573 |
| 2006/0131655 | A1* | 6/2006 | Kunnen | H01L 21/764 |
| | | | | 438/619 |
| 2010/0230741 | A1* | 9/2010 | Choi | H01L 29/7881 |
| | | | | 257/E29.02 |
| 2011/0260294 | A1* | 10/2011 | Oh | H01L 21/76232 |
| | | | | 438/424 |
| 2012/0037962 | A1* | 2/2012 | Breyta | H01L 23/5329 |
| | | | | 257/E21.585 |
| 2016/0049409 | A1* | 2/2016 | Yeom | H01L 21/76808 |
| | | | | 438/618 |
| 2017/0194191 | A1* | 7/2017 | Chen | H01L 23/53295 |
| 2017/0194243 | A1* | 7/2017 | Wu | H01L 21/76877 |
| 2017/0330832 | A1* | 11/2017 | He | H01L 27/1203 |
| 2018/0211964 | A1* | 7/2018 | Feng | H10B 12/482 |
| 2018/0219063 | A1* | 8/2018 | Zhou | H01L 29/66545 |
| 2019/0035887 | A1* | 1/2019 | Zhou | H01L 28/10 |
| 2019/0096742 | A1* | 3/2019 | Tsai | H01L 23/5283 |
| 2019/0096819 | A1* | 3/2019 | Chen | H01L 21/31144 |
| 2019/0172753 | A1* | 6/2019 | Lin | H01L 21/823481 |
| 2019/0206718 | A1* | 7/2019 | LiCausi | H01L 23/528 |
| 2019/0206720 | A1* | 7/2019 | Verma | H01L 21/823481 |
| 2020/0020568 | A1* | 1/2020 | Lin | H01L 23/5226 |
| 2020/0066629 | A1* | 2/2020 | Schenker | H01L 21/0337 |
| 2020/0152736 | A1* | 5/2020 | Yu | H01L 21/764 |
| 2020/0194301 | A1* | 6/2020 | Wu | H01L 21/7682 |
| 2020/0303239 | A1* | 9/2020 | Penny | H01L 21/76816 |
| 2020/0388565 | A1* | 12/2020 | Lin | H01L 23/5222 |
| 2021/0143097 | A1* | 5/2021 | Kim | H01L 21/76883 |
| 2021/0335654 | A1* | 10/2021 | Zhou | H01L 23/5226 |
| 2022/0181199 | A1* | 6/2022 | Zhou | H01L 21/76897 |
| 2022/0376100 | A1* | 11/2022 | Yang | H01L 29/7786 |
| 2023/0369481 | A1* | 11/2023 | Yang | H01L 29/7786 |
| 2023/0387089 | A1* | 11/2023 | Chang | H01L 23/585 |
| 2023/0411489 | A1* | 12/2023 | Zhang | H01L 21/76814 |

FOREIGN PATENT DOCUMENTS

| | | | | |
|---|---|---|---|---|
| CN | 104022069 | | 9/2014 | |
| CN | 106952869 | | 7/2017 | |
| CN | 110858562 | | 3/2020 | |
| CN | 113658868 | B * | 8/2023 | ......... H01L 21/0332 |
| CN | 116806096 | A * | 9/2023 | ............. G11C 5/063 |
| DE | 102017207777 | A1 * | 11/2017 | ......... H01L 21/7682 |
| TW | 201123346 | | 7/2011 | |

\* cited by examiner

SEMICONDUCTOR DEVICE AND METHOD FOR FABRICATING SEMICONDUCTOR DEVICE

CROSS-REFERENCE TO RELATED APPLICATION

This application is a continuation-in-part application of and claims the priority benefit of U.S. application Ser. No. 16/884,081, filed on May 27, 2020, now allowed. The prior U.S. application Ser. No. 16/884,081 claims the priority benefit of Chinese patent application serial no. 202010344144.4, filed on Apr. 27, 2020. The entirety of each of the above-mentioned patent applications is hereby incorporated by reference herein and made a part of this specification.

BACKGROUND OF THE INVENTION

Field of the Invention

The invention relates to a semiconductor fabrication technology, in particular, to a semiconductor device and a method for fabricating semiconductor device.

Description of Related Art

As to the development of semiconductor fabrication technology, the fabrication process may take a silicon-on-insulator (SOI) substrate to fabricate the semiconductor device. The SOI substrate has thin semiconductor layer, such as silicon layer, to provide the semiconductor properties for the device, such as providing the channel effect for the field effect transistor.

The semiconductor circuit may take the SOI substrate to fabricate the semiconductor devices. In addition, the interconnect structures and other devices as needed may also be formed on both sides of the substrate. The interconnect structures are usually fabricated with the physical part of inter-layer dielectric layer.

When the device density increases, the distance for connecting between the device and the interconnect structure would be accordingly reduced. The parasitic capacitance effect would be more obviously occurring. As usually known, the increase of the parasitic capacitance would cause the increase of resistance-capacitance (RC) effect and then the operation speed would get decreased.

Under the condition that the interconnect structure remains the same as designed, the way to reduce the parasitic capacitance may adjust the dielectric material as involved. For example, the dielectric material with lower dielectric constant as used may reduce the parasitic capacitance.

As usually known, the dielectric constant of air is rather approaching to 1, which is the material basically having the lowest dielectric constant. In this manner, during fabricating the device, a portion of the physical part of the inter-layer dielectric structure may be replaced with the air gap, resulting in reducing the dielectric constant as averaged in whole.

The air gap is a space not a physical part, it needs to change the design of the dielectric structure in fabrication, so as to form the air gap embedded in the dielectric layer. How to additionally form the air gap in the dielectric layer is an issue in development, needing to be considered in design. As the volume of the air gap increases, the parasitic capacitance would be according reduced.

SUMMARY OF THE INVENTION

The invention provides a semiconductor device and a method for fabricating the semiconductor device. In the fabrication process to form the semiconductor device based on the SOI substrate, the air gap may be formed in the buried dielectric layer. The air gap in an example may be formed at the region near to device structure, so to effectively reduce the parasitic capacitance.

In an embodiment, the invention provides a semiconductor device. The semiconductor device includes a device substrate, having a device structure layer and a buried dielectric layer, wherein the buried dielectric layer is disposed on a semiconductor layer of the device structure layer and the device substrate comprises a device structure. A metal layer is disposed on the buried dielectric layer and surrounded by a first inter-layer dielectric (ILD) layer. A region of the metal layer has a plurality of openings. The buried dielectric layer has an air gap under and exposing the region of the metal layer with the openings, wherein the air gap is located above the device structure in the device substrate. A second ILD layer is disposed on the metal layer and sealing the air gap at the openings of the metal layer.

In an embodiment, as to the semiconductor device, the second ILD layer includes an interconnect structure embedded in the second ILD layer and electrically connecting to the metal layer.

In an embodiment, as to the semiconductor device, it further comprises a through plug in the device substrate and the buried dielectric layer to connect between the metal layer and the device structure.

In an embodiment, as to the semiconductor device, the openings of the metal layer are a plurality of parallel slits.

In an embodiment, as to the semiconductor device, the openings of the metal layer are a plurality of holes arranged in an array distribution.

In an embodiment, as to the semiconductor device, the first ILD layer surrounds the metal layer and covers a sidewall of the openings of the metal layer to reduce an aperture size of the openings.

In an embodiment, as to the semiconductor device, wherein a sidewall of the openings of the metal layer remains not covered by the first ILD layer.

In an embodiment, as to the semiconductor device, it further comprises a mask layer between the metal layer and the second ILD layer, wherein the mask layer has a plurality of openings, wherein each of the openings of the mask layer is located between and partially overlapping with adjacent two of the openings of the metal layer.

In an embodiment, as to the semiconductor device, the device structure comprises a transistor device and the air gap is located above a channel of the transistor device.

In an embodiment, as to the semiconductor device, the transistor device is disposed on an SOI substrate.

In an embodiment, the invention also provides a method for fabricating a semiconductor device. The method comprises providing a device substrate, having a device structure layer and a buried dielectric layer, wherein the buried dielectric layer is disposed on a semiconductor layer of the device structure layer and the device substrate comprises a device structure. A metal layer is formed on the buried dielectric layer, wherein a first inter-layer dielectric (ILD) layer surrounds the metal layer, wherein a region of the metal layer has a plurality of openings. An air gap is formed in the buried dielectric layer under and exposing the region of the metal layer with the openings, and the air gap is located above the device structure in the device substrate. A second ILD layer is formed on the metal layer and sealing the air gap at the openings of the metal layer.

In an embodiment, as to the method for fabricating the semiconductor device, the second ILD layer as formed includes an interconnection structure buried therein, electrically connecting to the metal layer.

In an embodiment, as to the method for fabricating the semiconductor device, it further comprises forming a through plug in the device substrate and the buried dielectric layer to connect between the metal layer and the device structure.

In an embodiment, as to the method for fabricating the semiconductor device, the openings of the metal layer are a plurality of parallel slits.

In an embodiment, as to the method for fabricating the semiconductor device, the openings of the metal layer are a plurality of holes arranged in an array distribution.

In an embodiment, as to the method for fabricating the semiconductor device, the first ILD layer surrounds the metal layer and covers a sidewall of the openings of the metal layer to reduce an aperture size of the openings.

In an embodiment, as to the method for fabricating the semiconductor device, a sidewall of the openings of the metal layer remains not covered by the first ILD layer.

In an embodiment, as to the method for fabricating the semiconductor device, it further comprises forming a mask layer between the metal layer and the second ILD layer, wherein the mask layer has a plurality of openings, wherein each of the openings of the mask layer is located between and partially overlapping with adjacent two of the openings of the metal layer.

In an embodiment, as to the method for fabricating the semiconductor device, the device structure comprises a transistor device and the air gap is located above a channel of the transistor device.

In an embodiment, as to the method for fabricating the semiconductor device, the transistor device is disposed on an SOI substrate.

In order to make the aforementioned and other objectives and advantages of the present invention comprehensible, embodiments accompanied with figures are described in detail below.

DESCRIPTION OF THE EMBODIMENTS

The invention is directed to a semiconductor device and the fabrication method thereof. The structure of semiconductor device is fabricated based on the circuit as design by use of semiconductor fabrication technology. In an example, the SOI substrate is used to fabricate the semiconductor device. After the device structure and an interconnect structure as needed are fabricated on the substrate, the working base substrate at the backside is removed to expose the buried dielectric layer. A further interconnect structure and other device structures are subsequently fabricated on the buried dielectric layer.

In the invention, an air gap may be further formed in the buried dielectric layer. The air gap in an example is near to the device structure or near to a transistor structure in a further example. Due to the formation of the air gap, the parasitic capacitance may be effectively reduced and the operation performance of the semiconductor device may be improved.

Several embodiments are provided to describe the invention but the invention is not just limited to the embodiments as provided. In addition, combination between the embodiments as provided may also be made.

Figure 1:
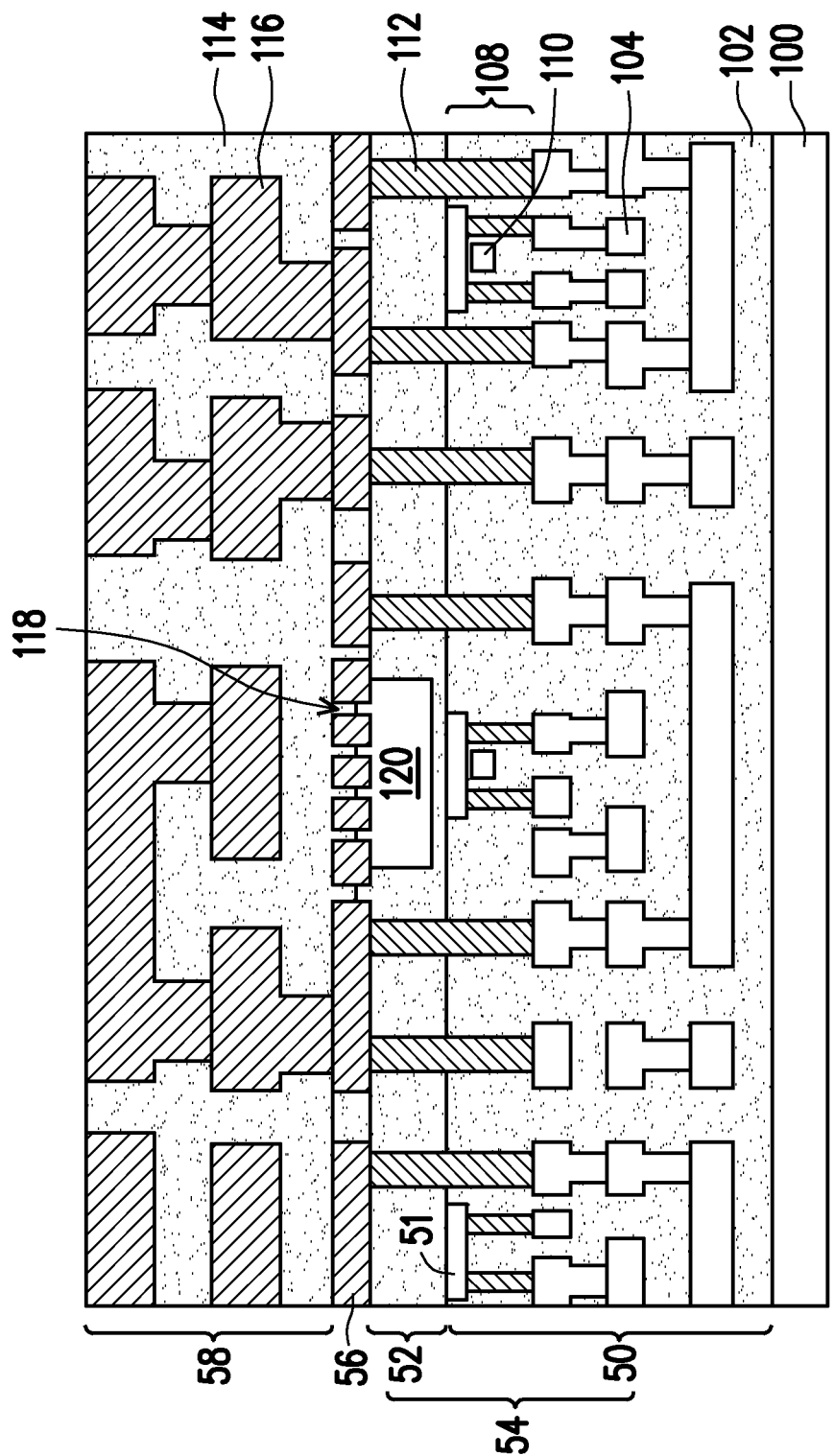
FIG. 1 is a drawing, schematically illustrating a structure of semiconductor device in cross-section view, according to an embodiment of the invention.

FIG. 1 is a drawing, schematically illustrating a structure of semiconductor device in cross-section view, according to an embodiment of the invention. Referring to FIG. 1, the structure of semiconductor device includes a device substrate 54. In an embodiment, the device substrate 54 includes device structure layer 50 and a buried dielectric layer 52. The buried dielectric layer 52 is disposed on a semiconductor layer 51 of the device structure layer 50. In an embodiment, the buried dielectric layer 52 is a buried oxide layer as an example.

Taking a structure based on the SOI substrate as an example, it includes the buried dielectric layer 52 and a semiconductor layer 51 on the buried dielectric layer 52. The semiconductor layer 51 in an example is a silicon layer. The semiconductor layer 51 is taken as the base to form a device structure 110 in an example, such as a transistor structure. In addition, the interconnect structure 104 is also formed to connect between the various device structures 110, in which the structure of the ILD layer in accordance with the need in fabrication is also involved. Further, the devices associating with the semiconductor layer 51, such as the transistor device, are fabricated to compose as the semiconductor structure layer 108, which are further connected by the interconnect structure 104. Generally as a whole, the device substrate 54 in an example includes the device structure layer 50 as having been preliminarily fabricated. Here, based on the semiconductor fabrication processes, formation of the device structure 110 and the interconnect structure et al. in the device structure layer 50 involves using multiple dielectric layers 102 in different stages, the detail is not further described. Then, the SOI substrate is flipped and disposed on a supporting substrate 100. Subsequently, the work substrate at the other side of the buried dielectric layer 52 is removed to expose the buried dielectric layer 52 to provide a working plane for the subsequent fabrication processes.

Generally, the invention is not necessary to be limited to the specific device structure formed in the device structure layer 50. In an embodiment, an air gap 120 at the predetermined region would be formed in the buried dielectric layer 52, in which as an example the air gap 120 is near to the device structure 110, capable of reducing the parasitic capacitance effect. Taking the device structure 110 as a transistor device as an example, the semiconductor layer 51 may form source, drain or channel for the transistor device, and the air gap 120 may be formed in the buried dielectric layer 52 and located above the channel of the transistor device to more effectively reduce the parasitic capacitance effect. In other words, the air gap 120 may be corresponding to the location of the channel of the transistor device.

In an embodiment, the formation of air gap 120 includes using a structure of metal layer 56. The metal layer 56 is disposed on the buried dielectric layer 52. Based on the semiconductor fabrication technology, the metal layer 56 is surrounded by ILD layer and is to be described later about the fabrication flow. The metal layer 56 at the predetermined region has multiple openings 118, which are used to form the air gap 120 in the buried dielectric layer 52. In other words, the air gap 120 is under the metal layer 56 at the region having the openings 118 and exposes the region of the metal layer 56, as for example described later in FIG. 5A about the region 80.

The metal layer 56 is also a part of interconnect structure and may be connected to the device structure in the device structure layer 50 by the through plug 112 in an example. The through plug 112 in an example may penetrate through the buried dielectric layer 52 and electrically connect to the interconnect structure.

As to the whole structure of the semiconductor device, the ILD layer 58 would be subsequently formed on the buried dielectric layer 52. Another ILD layer 116 is formed with multiple dielectric layers 114 and is generally represented as the ILD layer 58, in which the buried dielectric layer has been formed, having the intended structure, including the interconnect structure 116 for have the circuit routing structure in a whole. During the deposition to form the dielectric layer 114, the dielectric layer 114 would seal the air gap from the openings 118 of the metal layer 56. Since the aperture size of the opening 118 of the metal layer 56 is relatively small, the dielectric material substantially does not enter the air gap 120 and may seal the openings 118, then the air gap 120 is formed.

Figure 2:
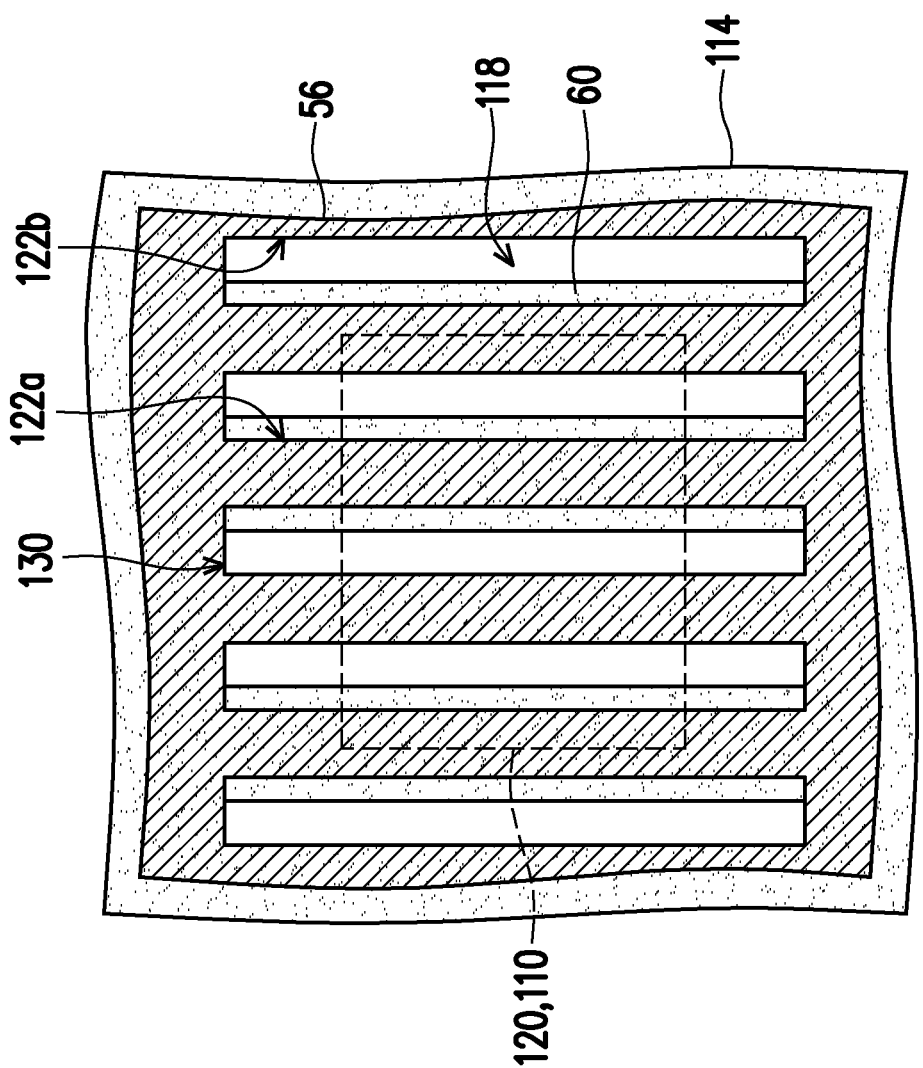
FIG. 2 is a drawing, schematically illustrating a partial structure of semiconductor device in top view, according to further an embodiment of the invention.

FIG. 2 is a drawing, schematically illustrating a partial structure of semiconductor device in top view, according to further an embodiment of the invention. Referring to FIG. 2, the openings 118 in an example are formed by parallel slits. In addition, if the aperture size of the openings 118 are relative large, the ILD layer 60 as involved with the metal layer 56 may also cover the sidewall 122a of the openings 118 to reduce the aperture size, for example, covering at least a portion of the sidewall. The aperture as reduced may be more effective for sealing the air gap 120. In an embodiment, the ILD layer 60 may cover the sidewall 122a of the opening 118 while another sidewall 122b of the opening 118 may remain not covered. Thus, the subsequent dielectric layer 114 may effectively seal the openings 118, and then further seal the air gap 120.

Figure 3:
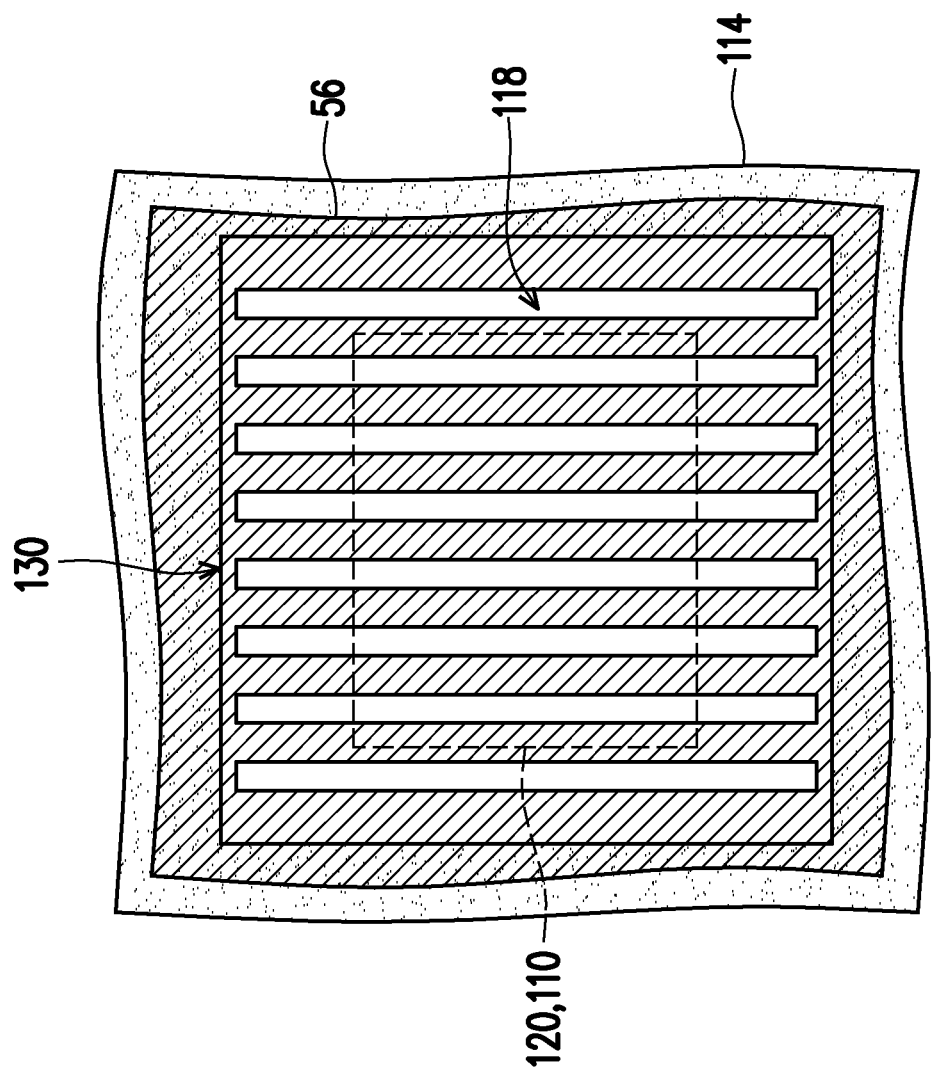
FIG. 3 is a drawing, schematically illustrating a partial structure of semiconductor device in top view, according to further an embodiment of the invention.

FIG. 3 is a drawing, schematically illustrating a partial structure of semiconductor device in top view, according to further an embodiment of the invention. Referring to FIG. 3, in an embodiment, if the aperture size of the openings 118 of the metal layer 56 is relatively and sufficiently small, the sidewall of the openings 118 are not necessarily covered by the ILD layer 60. Also, the dielectric layer 114 may have the opening 130, which exposes the openings 118 of the metal layer 56.

Figure 4:
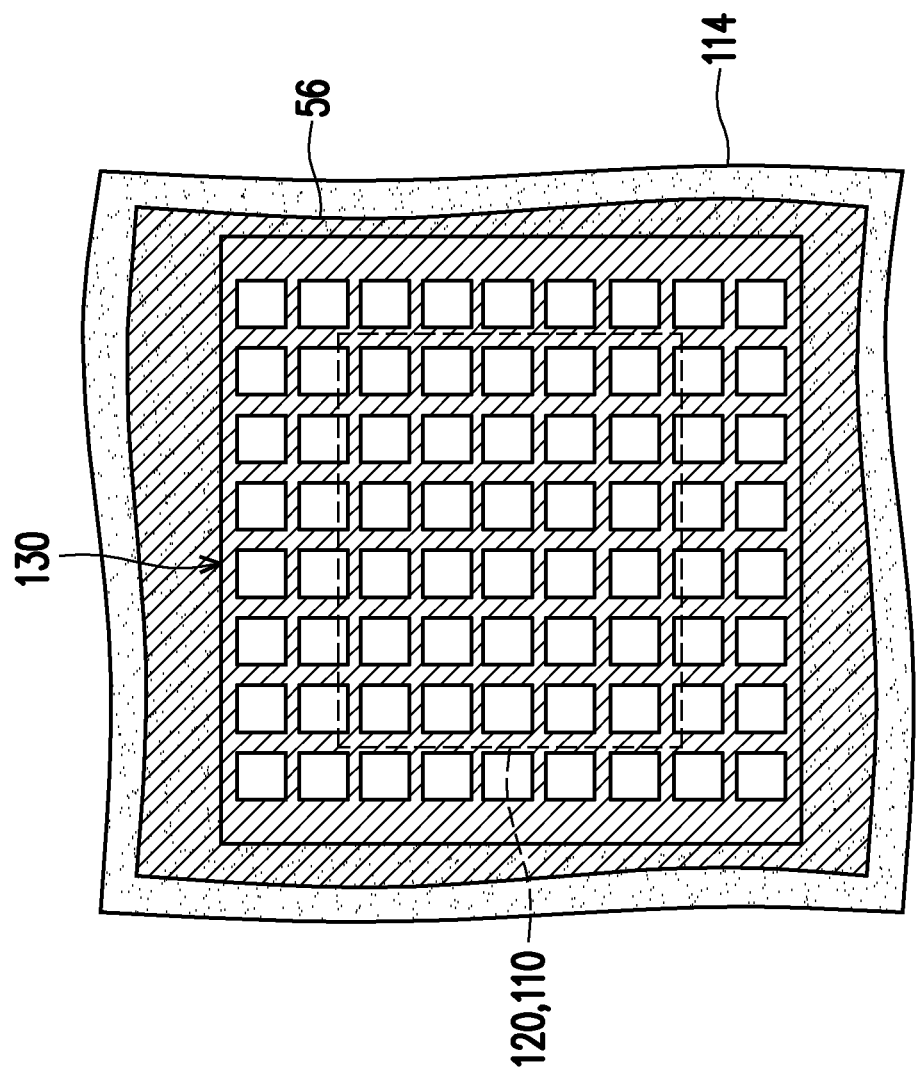
FIG. 4 is a drawing, schematically illustrating a partial structure of semiconductor device in top view, according to further an embodiment of the invention.

FIG. 4 is a drawing, schematically illustrating a partial structure of semiconductor device in top view, according to further an embodiment of the invention. Referring to FIG. 4, in an embodiment, the openings 118 of the metal layer 56 may also be a plurality holes, which are distributed in an array.

As described in FIG. 2 to FIG. 4, it is about the various choices for formations of the openings 118 of the metal layer 56. The mechanism of the openings 118, as to be described later about the fabrication processes, is used to form the air gap 120 in the buried dielectric layer 52. Further to state, the subsequent dielectric layer 114 may seal the openings 118 and then seal the air gap 120. The aperture size of the openings 118 in an example may be reduced by the remaining portion of the ILD layer 60 on the sidewall of the openings 118 of the metal layer 56. However, the geometric shape of the openings 118 is not just limited to the embodiments as provided.

Multiple embodiments are further provided to describe the method for fabricating the semiconductor device. FIG. 5A to FIG. 5E are drawings in cross-section view, schematically illustrating a processing flow of a method for fabricating semiconductor device.

Figure 5A:
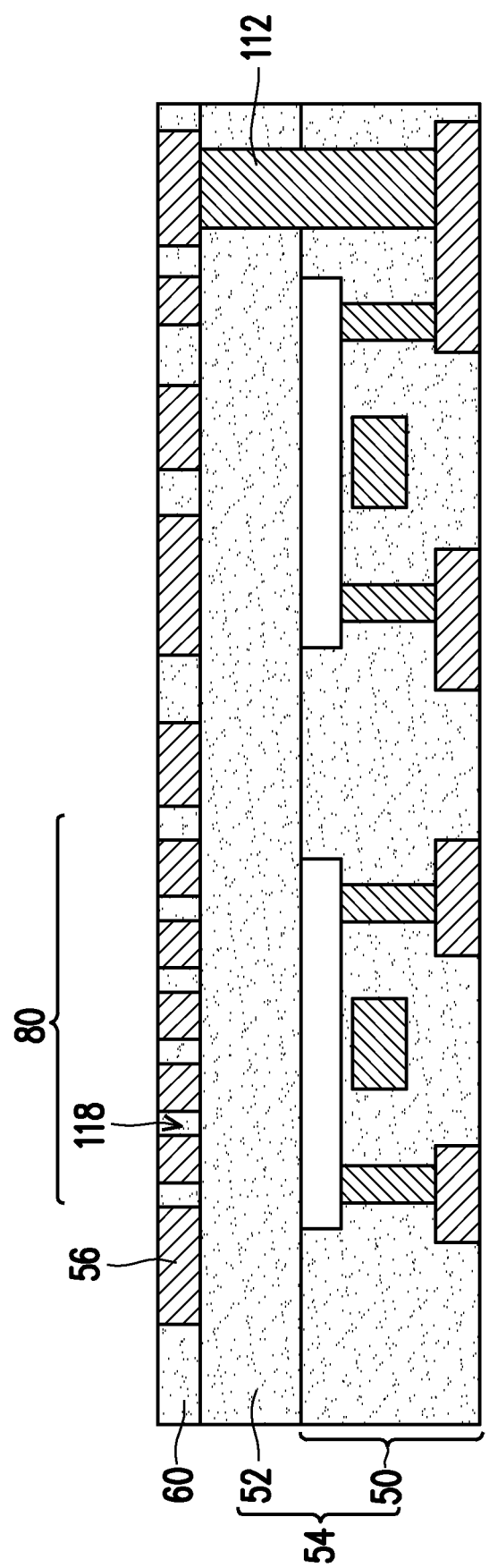
FIG. 5A to FIG. 5E are drawings in cross-section view, schematically illustrating a processing flow of a method for fabricating semiconductor device.

Referring to FIG. 5A, taking the device substrate 54 as a base, the subsequent processes include forming the metal layer 56. As for example described in FIG. 1, the device substrate 54 includes the device structure layer 50 and the buried dielectric layer 52. The semiconductor layer 51 of the device structure layer 50 is on one surface of the buried dielectric layer 52. The device substrate 52 in an example is a structure layer, which is fabricated by taking the SOI substrate as the base. The semiconductor layer 51 in an example is a silicon layer. However, the invention is not just limited to the embodiments as provided.

The metal layer 56 is formed with the ILD layer 60 in an example by defining the ILD layer to have the routing pattern as needed by the metal layer 56. Then, the metal material fills into the openings of the ILD layer 60 tor form the metal layer 56, which is also belonging to a part of the interconnect structure. Multiple openings 118 are formed in the metal layer 56 at the region 80, which is corresponding to the predetermined region to form the air gap. At current stage, the openings 118 are fully filled by the ILD layer 60.

Figure 5B:
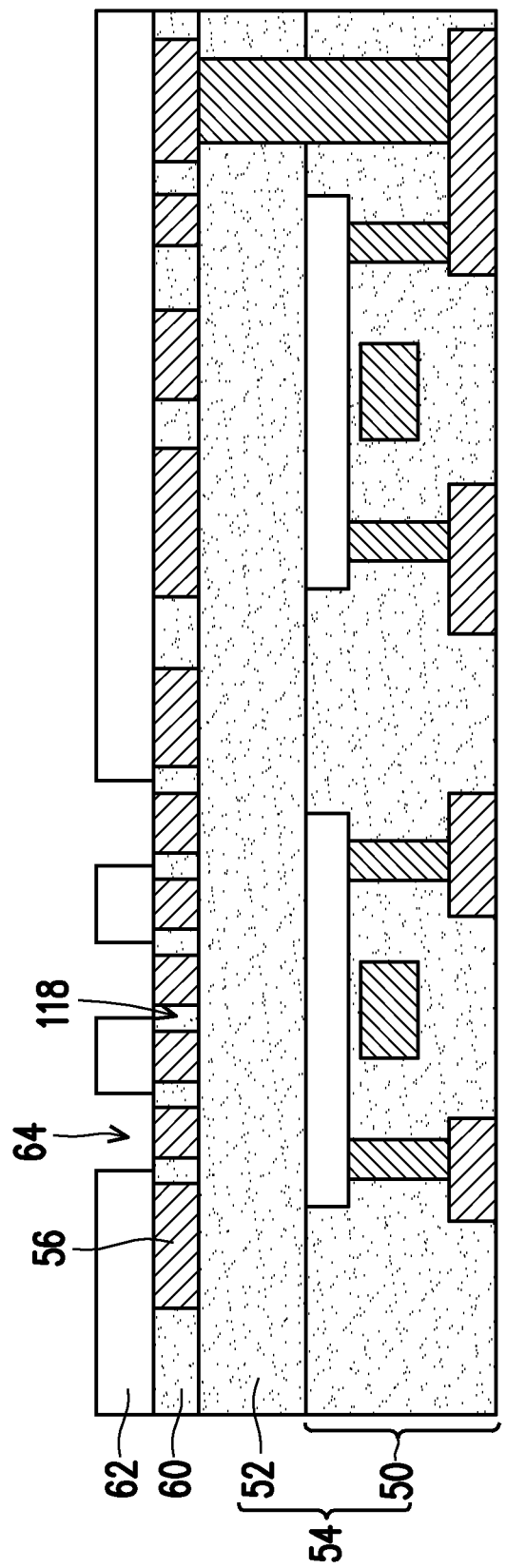

Referring to FIG. 5B, an etching mask layer 62 is formed on the metal layer 56 and also on the ILD layer 60. The etching mask layer 62 in an example covers a portion of the metal layer 60 and the OLD layer 60 other than the region 80 but the etching mask layer 62 has openings 64 located between adjacent two openings 118 and partially overlapping with the openings 118. Thus, the ILD layer 60 within the openings 118 may remain as an exposed state. In the embodiment, only one side of the openings 118 is exposed but the invention is not limited to. However, it has been sufficient that the opening 64 of the etching mask layer 62 just exposes a portion of the opening 118 of the metal 56. The effect may be obtained in FIG. 2 and the subsequent fabrication processes, so as to effectively reduce the aperture of the openings 118.

Figure 5C:
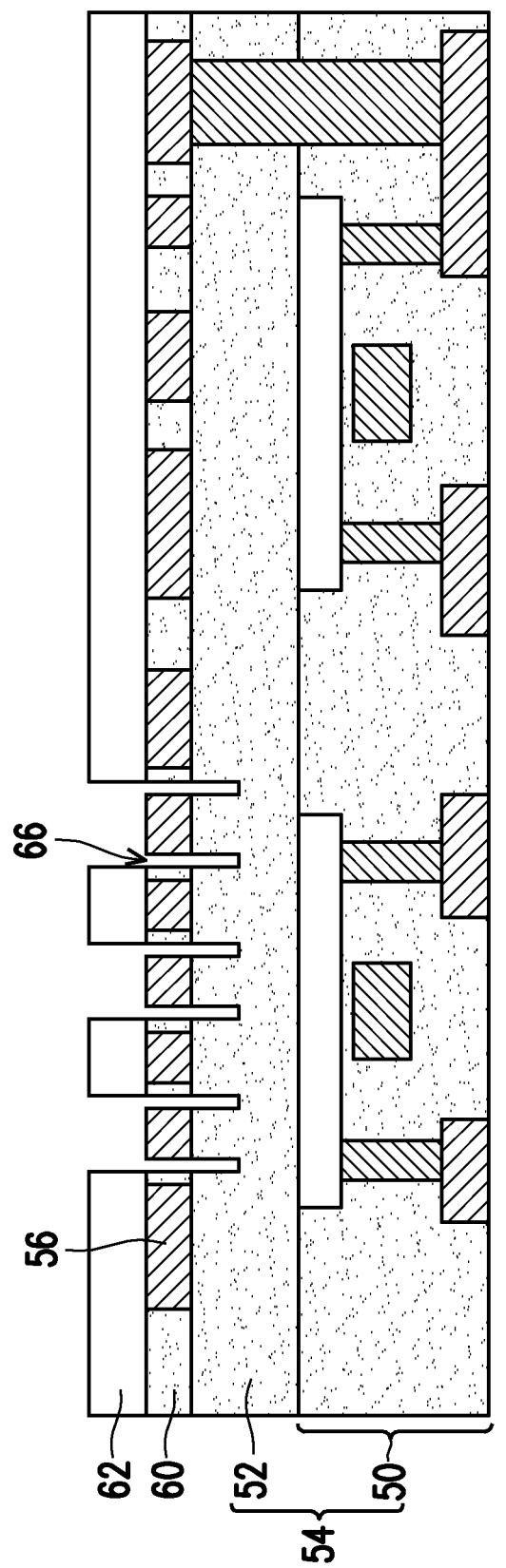

Referring to FIG. 5C, the etching process is performed on the ILD layer 60 through the openings 64 of the etching mask layer 62, so that the buried dielectric layer is exposed. The effective openings 66 are formed in the openings 118 of the metal layer 56. The openings 66 may enter to the buried dielectric layer 52.

Figure 5D:
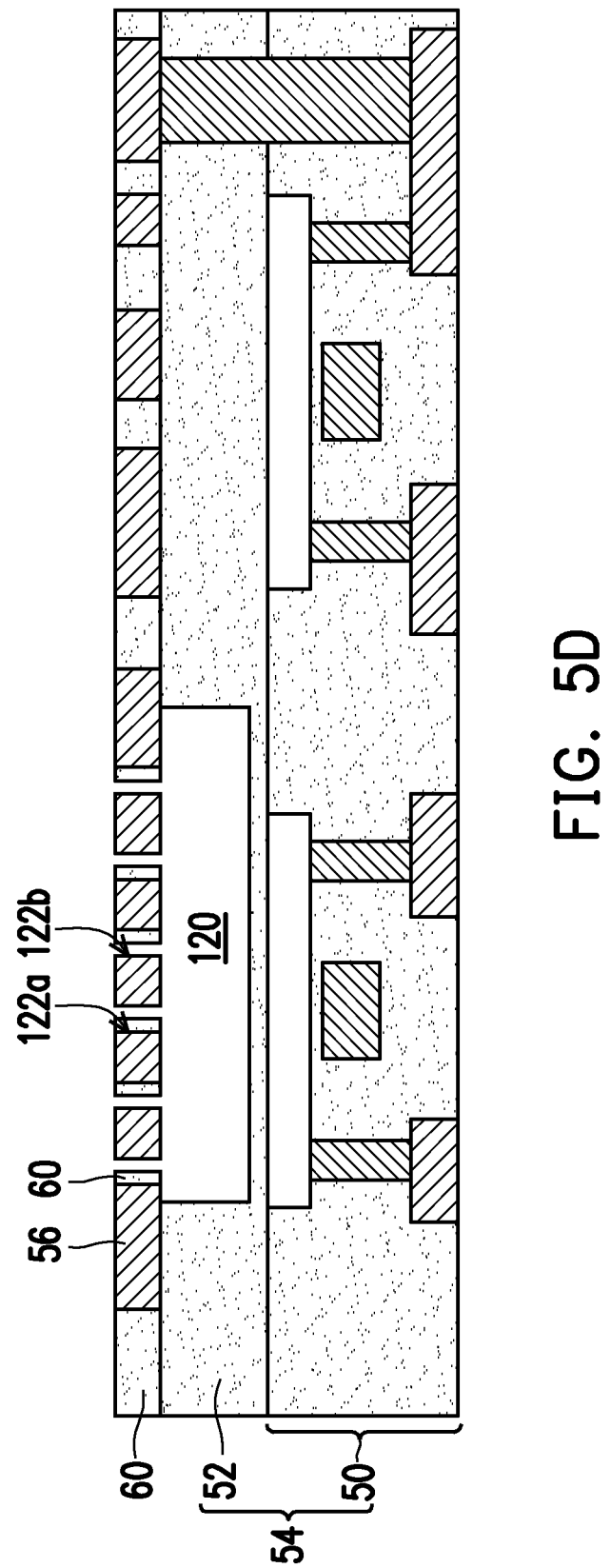

Referring to FIG. 5D, after removing the etching mask layer 62, a further etching process may be performed on the buried dielectric layer 52 through the openings 66, so as to form the air gap 120. In an embodiment, the buried dielectric layer 52 and the ILD layer 60 may be different. In the manner to form the openings 64 of the etching mask layer 62 and also taking the proper etchant, the ILD layer 60 would remain covering one sidewall 122a of the openings 64 while the other sidewall 122b is exposed. This structure is also corresponding to FIG. 2. In an embodiment, the air gap 120 for example is corresponding to the location of the device structure 110 in FIG. 1 but may not be necessary to expose the device structure 110 in an example. However, the location of the air gap 120 as formed in the invention is not just limited to the embodiments and may be located in accordance with region 80 as predetermined.

Figure 5E:
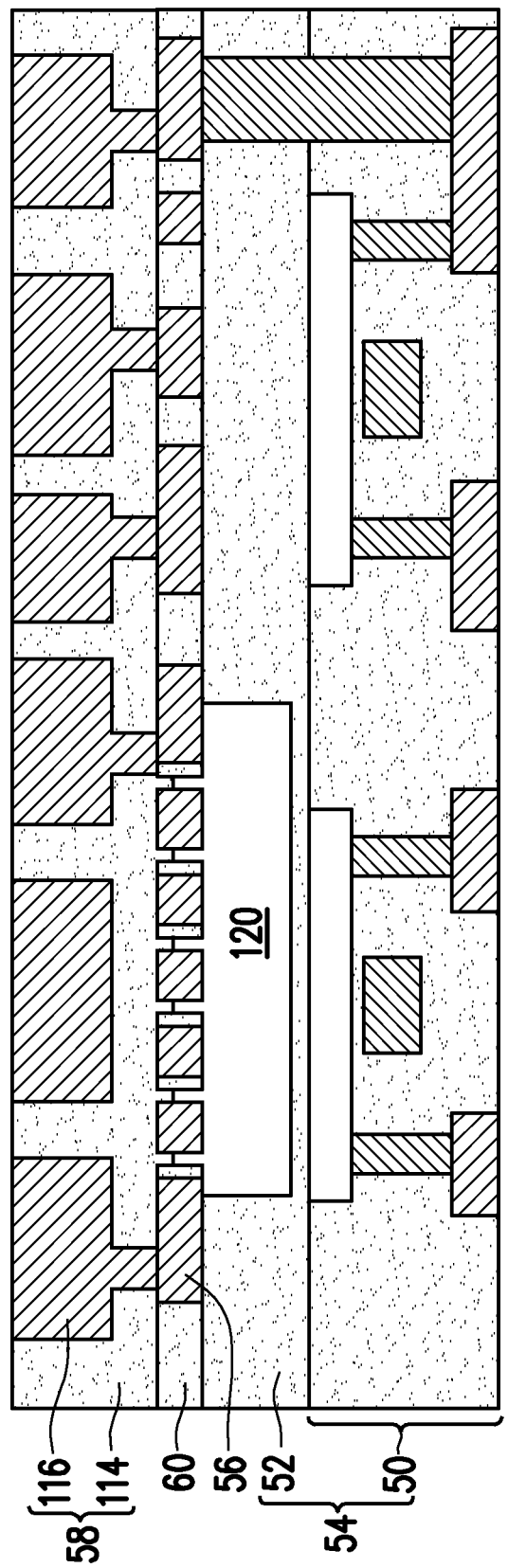

Referring to FIG. 5E, after the completion of forming the air gap 120 in the buried dielectric layer 52 at the predetermined location, the ILD layer 58 is subsequently formed. The ILD layer 58 includes the interconnect structure 116 as needed and the dielectric layer 114 as needed in the process to form the interconnect structure 116. The actual structure of the interconnect structure 116 is formed according to the interconnection routing as designed.

Here as noted, the dielectric layer 114 as formed would also fill into the openings 118 to form the effective opening 66 as shown in FIG. 5C. The dielectric layer 114 would seal the opening 66, 118 and then also seal the air gap 120.

A further embodiment is provided, referring to the structure in FIG. 3. FIG. 6A to FIG. 6E are drawings in cross-section view, schematically illustrating a processing flow of a method for fabricating semiconductor device.

Figure 6A:
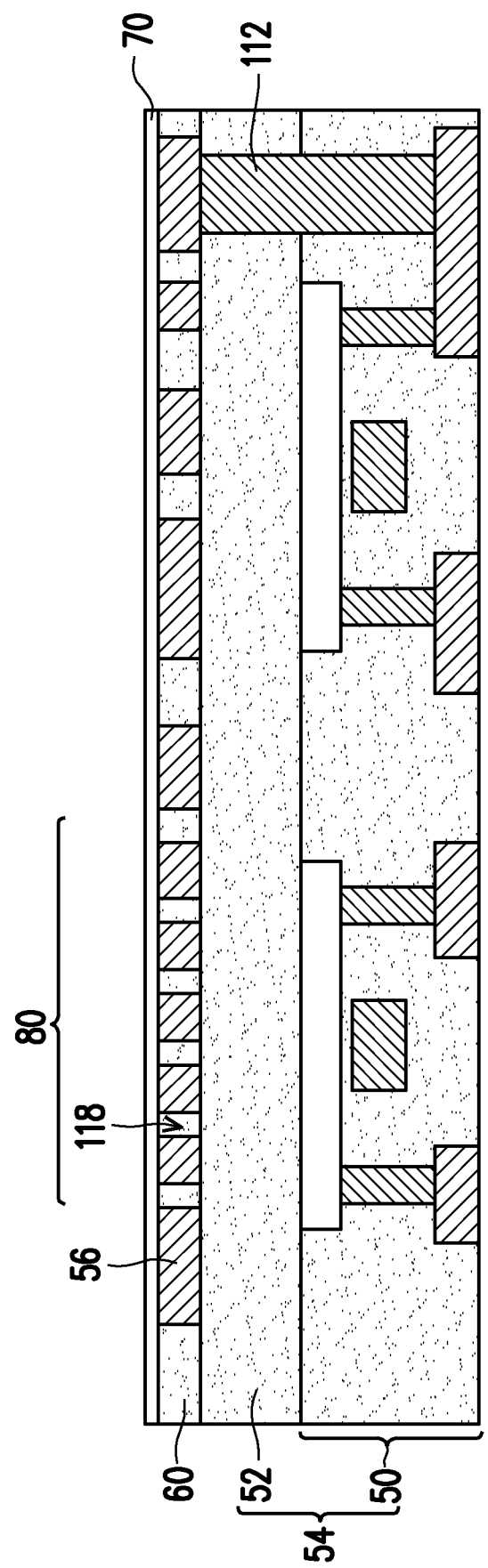
FIG. 6A to FIG. 6E are drawings in cross-section view, schematically illustrating a processing flow of a method for fabricating semiconductor device.

Referring to FIG. 6A, in an embodiment, the structure of the device substrate 54 including the buried dielectric layer 52 and device structure layer 50 is similar to the structure in FIG. 5A but a hard mask layer 70 in the embodiment is additionally formed on the ILD layer 60 and the metal layer 56 as an example. The hard mask layer 70 in an example may also serve as a stop layer. The hard mask layer 70 may also be treated as a part of ILD layer. The hard mask layer 70 is not absolutely required and may be serving as an etching stop layer for different materials in etching process at certain condition, and is helpful to form the opening structure as needed.

Figure 6B:
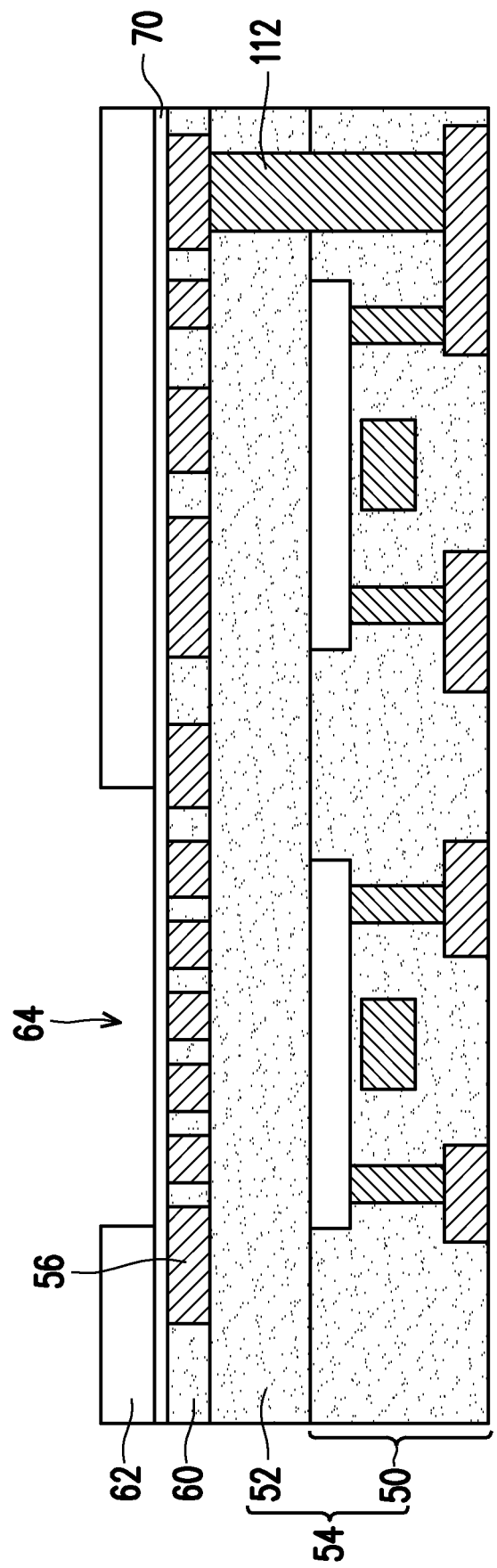

Referring to FIG. 6B, the etching mask layer 62 is formed on the hard mask layer 70. The etching mask layer 62 has openings 64 corresponding to the region 80 of the metal layer 56. The openings 64 also exposes a portion of the hard mask layer 70.

Figure 6C:
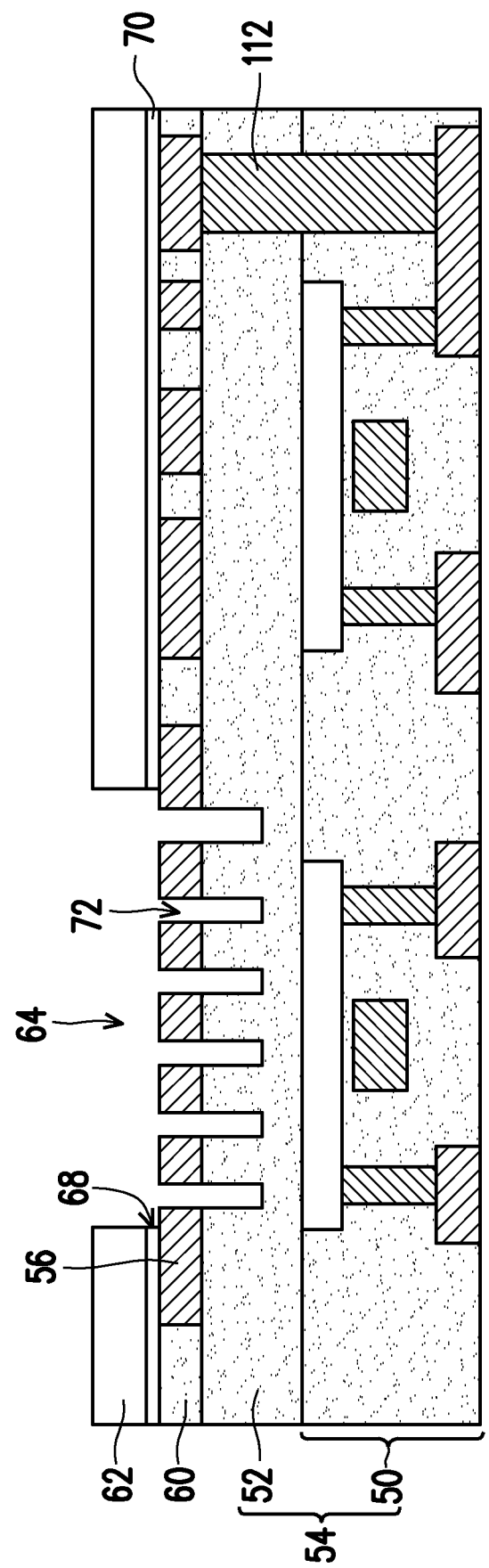

Referring to FIG. 6C, the etching process is performed on the hard mask layer 70 through the openings 64 of the etching mask layer 62 to form openings 68, which exposes a portion of the ILD layer 60 and the metal layer 56 corresponding to the region 80. The etching process is continuously performed to etch a portion of the ILD layer 60 within the openings 118 of the metal layer 56, and further etch a little portion of the buried dielectric layer 52. In other words, the effective opening 72 is formed. The opening 72 also exposes the buried dielectric layer 52.

Figure 6D:
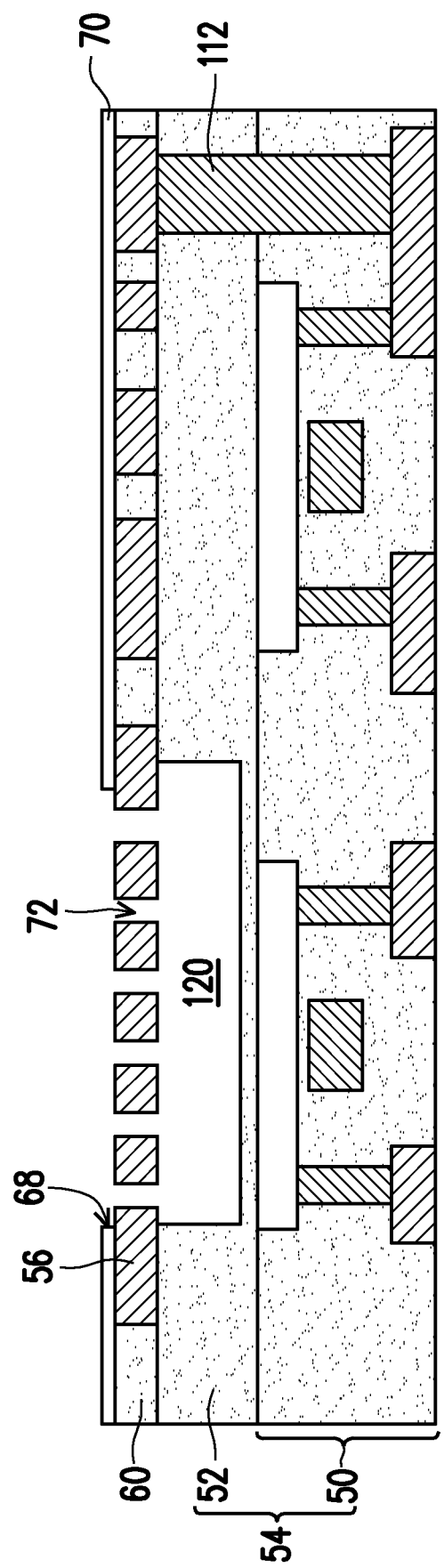

Referring to FIG. 6D, in an embodiment, the etching mask layer 62 is removed and the had mask layer 70 remains to serve as a mask for another etching process. As a result, the etching process form the air gap 120 in the buried dielectric layer 52 through the opening 72.

Figure 6E:
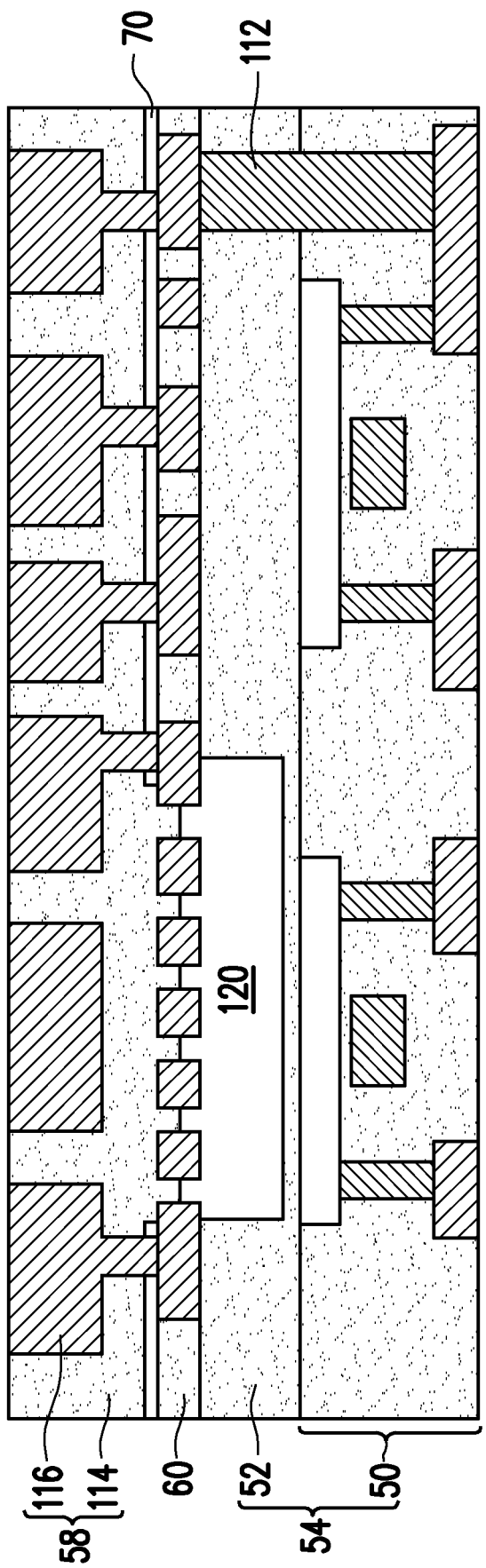

Referring to FIG. 6E, it is similar to the manner in FIG. 5E to form the ILD layer 58. In this embodiment, the aperture for the openings 118 of the metal layer 56 is sufficiently small, then corresponding to FIG. 3, there is no need to reserve the ILD layer 60 on the sidewall of the openings 118. The dielectric layer 114 may be easily seal the opening 118 of the metal layer 56. In addition, the hard mask layer 70 actually is also a portion of the ILD layer 58. The interconnect structure 116 may also penetrate through the hard mask layer 70 to connect to the metal layer 56.

As described in FIG. 2 to FIG. 4 in various manners, the geometric structures of the openings 118 are not just limited to the embodiments as provided. The opening 118 as formed is just needing to form the air gap 120 in the buried dielectric layer 52 and then the opening 118 can be sealed in later process.

In addition, in combination of the manner from FIG. 5A to FIG. 5E and the manner from FIG. 6A to FIG. 6E, another fabrication flow may be obtained. FIG. 7A to FIG. 7E are drawings in cross-section view, schematically illustrating a processing flow of a method for fabricating semiconductor device.

Figure 7A:
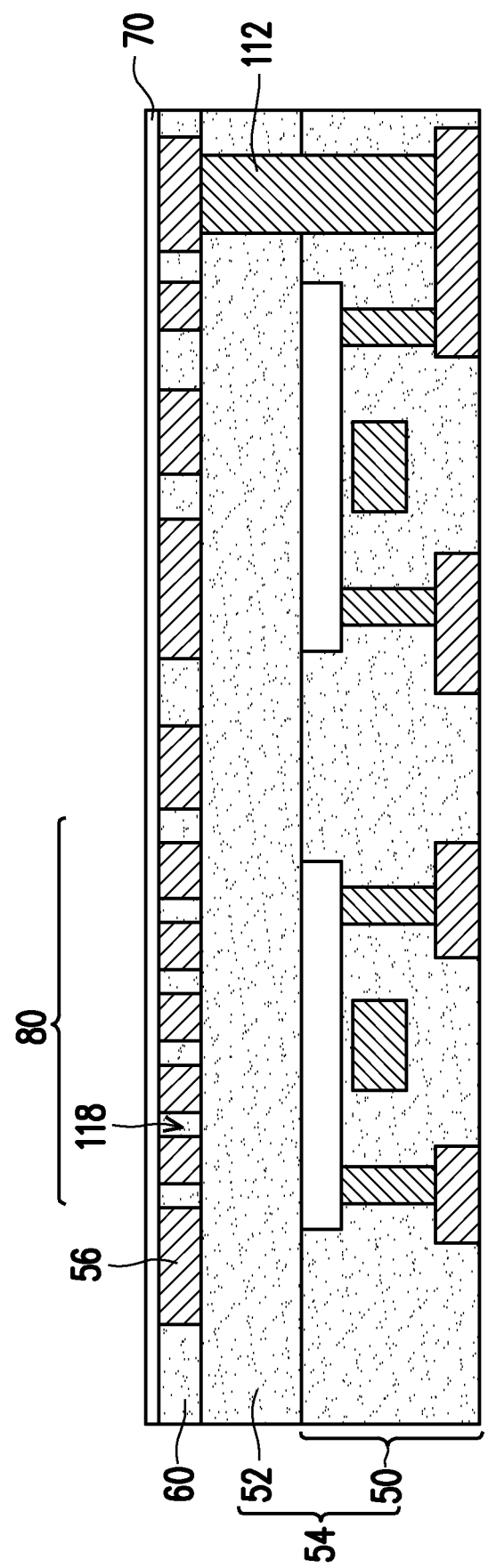
FIG. 7A to FIG. 7E are drawings in cross-section view, schematically illustrating a processing flow of a method for fabricating semiconductor device.
Figure 7B:
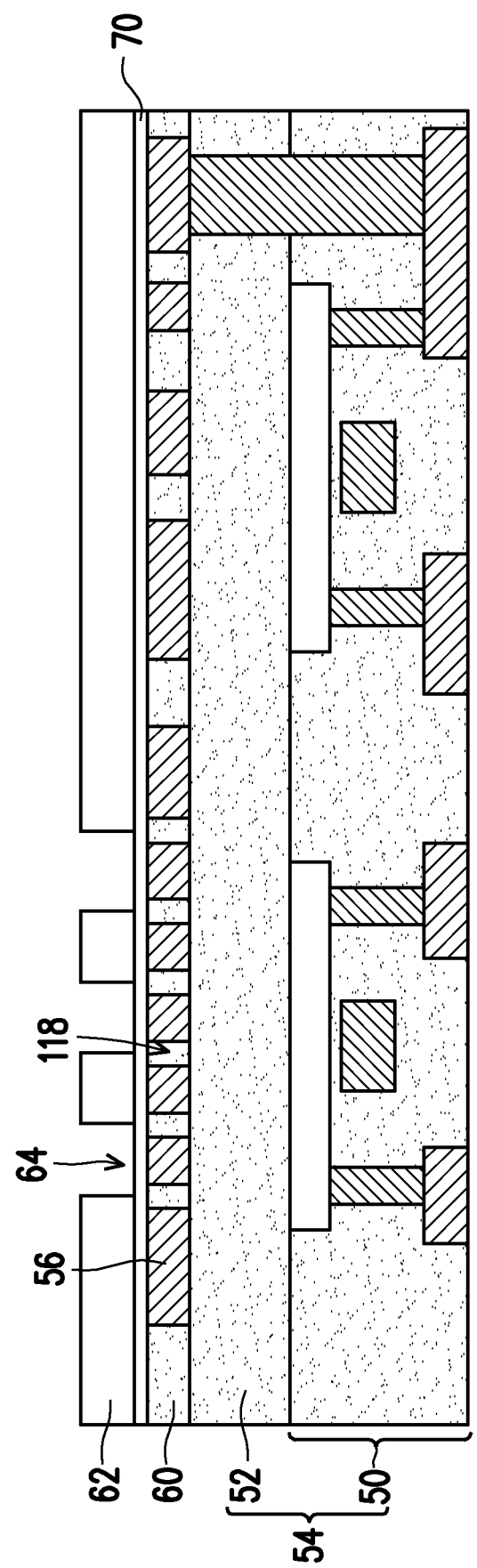

Referring to FIG. 7A, it is similar to FIG. 6A in structure, including the formation of the hard mask layer 70, and the descriptions are omitted. Referring to FIG. 7B, the openings 64 of the etching mask layer 62 may also take the manner in FIG. 5B, in which the openings 64 are just corresponding to a portion of the openings 118 of the metal layer 56. In other words as in an embodiment, it corresponds to the condition that the aperture size of the openings 118 is relative large.

Figure 7C:
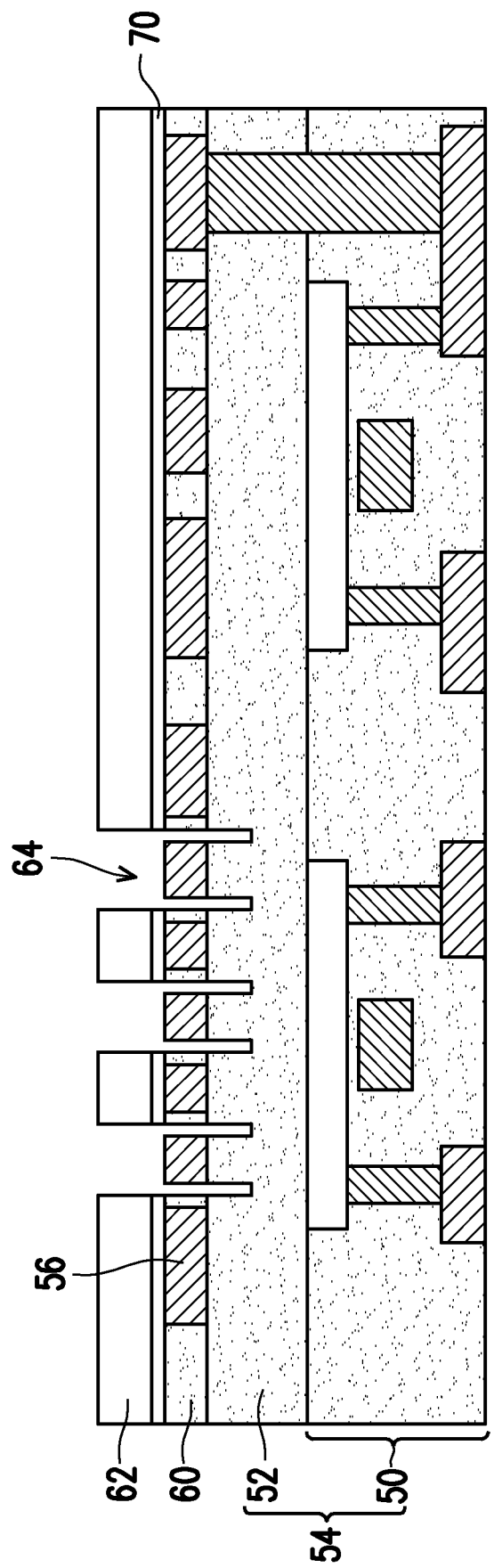

Referring to FIG. 7C, as described in FIG. 5C, the etching process is performed on the dielectric material through the openings 64 to expose the buried dielectric layer 52.

Figure 7D:
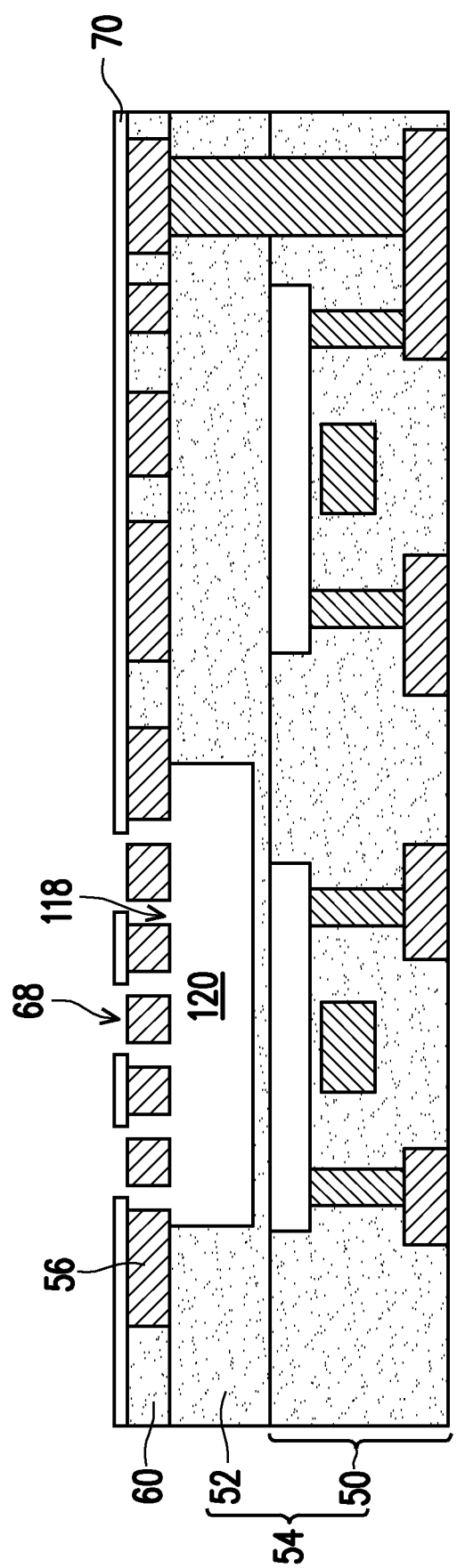

Referring to FIG. 7D, similar to FIG. 6D, after the etching mask layer 62 is removed, the hard mask layer 70 may serve as an etching mask layer, in which a proper etchant may be used to continuously etch through the openings 118 on the ILD layer 60 and the buried dielectric layer 52 under the region 80. Then, the air gap 120 is formed.

Figure 7E:
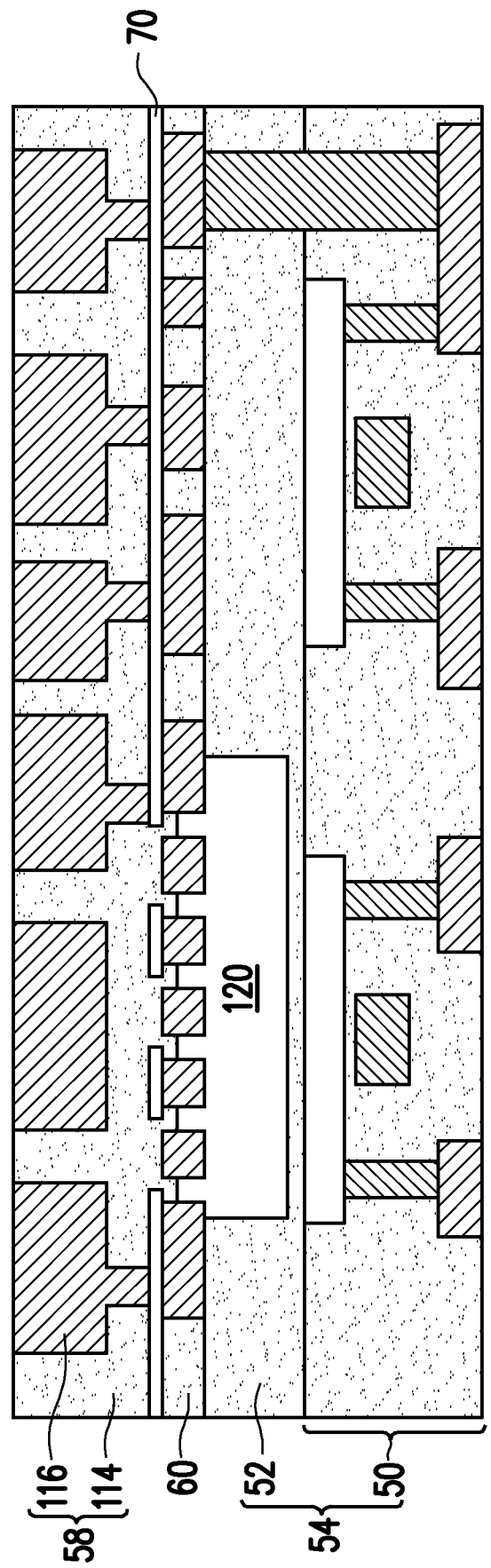

Referring to FIG. 7E, similar to FIG. 5E and FIG. 6E, the ILD layer 58 is subsequently formed on the hard mask layer 70. Here, the opening of the hard mask layer 70 partially overlaps with the opening 118 of the metal layer 56, then the dielectric layer 114 may also easily seal the openings 118.

Multiple embodiments are provided to describe the formation of the air gap 120 in the buried dielectric layer 52. The buried dielectric layer 52 in an embodiment may be the buried oxide layer in the SOI substrate but the invention is not just limited to this.

In the invention, the air gap 120 as formed in the buried dielectric layer 52 may reduce the parasitic capacitance. The air gap 120 is set corresponding to the device structure 110, in an embodiment, the parasitic capacitance between the device structure 110 and the interconnect structure 116 in the ILD layer 58 may at least be reduced.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A semiconductor device, comprising:
a device substrate, having a device structure layer and a buried dielectric layer, wherein the buried dielectric layer is disposed on a semiconductor layer of the device structure layer and the device substrate comprises a device structure;
a metal layer, disposed on the buried dielectric layer and surrounded by a first inter-layer dielectric (ILD) layer, wherein a region of the metal layer has a plurality of openings and the buried dielectric layer has an air gap under and exposing the region of the metal layer with the openings, wherein the air gap is located above the device structure in the device substrate; and a second ILD layer, disposed on the metal layer and sealing the air gap at the openings of the metal layer, wherein the device structure comprises a transistor device, and the air gap corresponds to a location of a channel of the transistor device.

2. The semiconductor device according to claim 1, wherein the second ILD layer includes an interconnect structure embedded in the second ILD layer and electrically connecting to the metal layer.

3. The semiconductor device according to claim 2, further comprising a through plug in the device substrate and the buried dielectric layer to connect between the metal layer and the device structure.

4. The semiconductor device of claim 1, wherein the openings of the metal layer are a plurality of parallel slits.

5. The semiconductor device of claim 1, wherein the openings of the metal layer are a plurality of holes arranged in an array distribution.

6. The semiconductor device of claim 1, wherein the first ILD layer surrounds the metal layer and covers a sidewall of the openings of the metal layer to reduce an aperture size of the openings.

7. The semiconductor device of claim 1, wherein a sidewall of the openings of the metal layer remains not covered by the first ILD layer.

8. The semiconductor device of claim 7, further comprising a mask layer between the metal layer and the second ILD layer, wherein the mask layer has a plurality of openings, wherein each of the openings of the mask layer is located between and partially overlapping with adjacent two of the openings of the metal layer.

9. The semiconductor device of claim 1, wherein the air gap is located above the channel of the transistor device.

10. The semiconductor device of claim 9, wherein the transistor device is disposed on an SOI substrate.

11. A method for fabricating a semiconductor device, comprising:

providing a device substrate, having a device structure layer and a buried dielectric layer, wherein the buried dielectric layer is disposed on a semiconductor layer of the device structure layer and the device substrate comprises a device structure;

forming a metal layer on the buried dielectric layer, wherein a first inter-layer dielectric (ILD) layer surrounds the metal layer, wherein a region of the metal layer has a plurality of openings;

forming an air gap in the buried dielectric layer under and exposing the region of the metal layer with the openings, wherein the air gap is located above the device structure in the device substrate; and forming a second ILD layer on the metal layer and sealing the air gap at the openings of the metal layer, wherein the device structure comprises a transistor device, and the air gap corresponds to a location of a channel of the transistor device.

12. The method for fabricating the semiconductor device in claim 11, wherein the second ILD layer as formed includes an interconnection structure buried therein, electrically connecting to the metal layer.

13. The method for fabricating the semiconductor device in claim 12, further comprising forming a through plug in the device substrate and the buried dielectric layer to connect between the metal layer and the device structure.

14. The method for fabricating the semiconductor device in claim 11, wherein the openings of the metal layer are a plurality of parallel slits.

15. The method for fabricating the semiconductor device in claim 11, wherein the openings of the metal layer are a plurality of holes arranged in an array distribution.

16. The method for fabricating the semiconductor device in claim 11, wherein the first ILD layer surrounds the metal layer and covers a sidewall of the openings of the metal layer to reduce an aperture size of the openings.

17. The method for fabricating the semiconductor device in claim 11, wherein a sidewall of the openings of the metal layer remains not covered by the first ILD layer.

18. The method for fabricating the semiconductor device in claim 17, further comprising forming a mask layer between the metal layer and the second ILD layer, wherein the mask layer has a plurality of openings, wherein each of the openings of the mask layer is located between and partially overlapping with adjacent two of the openings of the metal layer.

19. The method for fabricating the semiconductor device in claim 11, wherein the air gap is located above the channel of the transistor device.

20. The method for fabricating the semiconductor device in claim 19, wherein the transistor device is disposed on an SOI substrate.

* * * * *